United States Patent
Kim et al.

(10) Patent No.: US 8,853,069 B2
(45) Date of Patent: Oct. 7, 2014

(54) FIELD EFFECT TRANSISTOR AND METHOD OF FABRICATION

(75) Inventors: Hoon Kim, Guilderland, NY (US);
Kisik Choi, Grand Cayman (KY);
Chanro Park, Clifton Park, NY (US)

(73) Assignee: Globalfoundries Inc., Grand Cayman (KY)

( * ) Notice: Subject to any disclaimer, the term of this patent is extended or adjusted under 35 U.S.C. 154(b) by 0 days.

(21) Appl. No.: 13/607,954

(22) Filed: Sep. 10, 2012

(65) Prior Publication Data
US 2014/0070283 A1   Mar. 13, 2014

(51) Int. Cl.
| H01L 21/3205 | (2006.01) |
| H01L 21/4763 | (2006.01) |
| H01L 21/28   | (2006.01) |
| H01L 29/49   | (2006.01) |
| H01L 29/78   | (2006.01) |
| H01L 29/66   | (2006.01) |
| H01L 29/51   | (2006.01) |

(52) U.S. Cl.
CPC ..... *H01L 21/28008* (2013.01); *H01L 29/66545* (2013.01); *H01L 29/4966* (2013.01); *H01L 21/28194* (2013.01); *H01L 21/28088* (2013.01); *H01L 29/78* (2013.01); *H01L 29/517* (2013.01)

USPC .......................................... 438/592; 257/288

(58) Field of Classification Search
USPC ........... 257/410, 412, 751, 288; 438/586, 592
See application file for complete search history.

(56) References Cited

U.S. PATENT DOCUMENTS

| 6,203,613 B1 * | 3/2001 | Gates et al. ............... 117/104 |
| 2007/0059925 A1 * | 3/2007 | Choi et al. ............... 438/640 |
| 2009/0236746 A1 * | 9/2009 | Kitamura et al. ........... 257/751 |
| 2011/0006436 A1 * | 1/2011 | Khoueir et al. ............ 257/774 |
| 2012/0139061 A1 * | 6/2012 | Ramachandran et al. .... 257/410 |
| 2013/0193577 A1 * | 8/2013 | Tseng et al. ............... 257/751 |

OTHER PUBLICATIONS

Merriam-Webster Dictionary—definition of term "base".*

* cited by examiner

*Primary Examiner* — Errol Fernandes
(74) *Attorney, Agent, or Firm* — Keohane & D'Alessandro PLLC

(57) ABSTRACT

An improved field effect transistor and method of fabrication are disclosed. A barrier layer stack is formed in the base and sidewalls of a gate cavity. The barrier layer stack has a first metal layer and a second metal layer. A gate electrode metal is deposited in the cavity. The barrier layer stack is thinned or removed on the sidewalls of the gate cavity, to more precisely control the voltage threshold of the field effect transistor.

15 Claims, 11 Drawing Sheets

FIELD EFFECT TRANSISTOR AND METHOD OF FABRICATION

BACKGROUND

1. Technical Field

The present invention relates generally to semiconductor fabrication, and more particularly, to an improved replacement metal gate of a field effect transistor and method of fabrication.

2. Related Art

Complimentary metal-oxide-silicon (CMOS) technology is used in many integrated circuits. CMOS technology utilizes n-channel metal-oxide-silicon field effect transistors (n-MOSFETs) often shortened to NFETs and p-channel metal-oxide-silicon field effect transistors (p-MOSFETs) often shortened to PFETs. Conventional NFETs and PFETs are well known in the art and comprise a source region and a drain region on opposite sides of a channel region formed in single-crystal silicon with a gate electrode formed on top of a gate dielectric layer which is itself formed on top of the channel region.

Some semiconductor devices, such as high performance processor devices, can include millions of field effect transistors. For such devices, decreasing transistors size, and thus increasing transistor density, has traditionally been a high priority in the semiconductor manufacturing industry. It is therefore desirable to have an improved field effect transistor and method of fabrication.

SUMMARY OF THE INVENTION

In general, embodiments of the invention provide an improved field effect transistor and method of fabrication. A barrier layer stack is formed in the base and sidewalls of a gate cavity. The barrier layer stack has a first metal layer and a second metal layer. A gate electrode metal is deposited in the cavity. The barrier layer stack is thinned or removed on the sidewalls of the gate cavity, to more precisely control the voltage threshold of the field effect transistor.

A first aspect of the present invention provides a method of fabricating a semiconductor structure, comprising: depositing a first barrier layer in a cavity in a dielectric layer, the cavity having a base and sidewalls; depositing a second barrier layer over the first barrier layer depositing a first metal layer in the cavity, disposed over the second barrier layer; removing the second barrier layer from the sidewalls of the cavity; and depositing a second metal layer in the cavity.

A second aspect of the present invention provides a method of fabricating a semiconductor structure comprising: depositing a first barrier layer in a cavity in a dielectric layer, the cavity having a base and sidewalls; depositing a second barrier layer over the first barrier layer; depositing a first metal layer in the cavity via radio frequency based physical vapor deposition, wherein the first metal layer is disposed over the second barrier layer; removing the second barrier layer from the sidewalls of the cavity; and depositing a second metal layer in the cavity.

A third aspect of the present invention provides a semiconductor structure, comprising: a first dielectric layer, comprising a cavity formed therein, the cavity having sidewalls and a base; a second dielectric layer disposed in the cavity; a first barrier layer disposed on the base of the cavity; a second barrier layer disposed on the first barrier layer; a first metal layer disposed in the cavity, on the second barrier layer; and a second metal layer disposed in the cavity, on the first metal layer.

BRIEF DESCRIPTION OF THE DRAWINGS

The structure, operation, and advantages of the present invention will become further apparent upon consideration of the following description taken in conjunction with the accompanying figures. The figures are intended to be illustrative, not limiting.

Certain elements in some of the figures may be omitted, or illustrated not-to-scale, for illustrative clarity. In some cases, in particular pertaining to signals, a signal name may be oriented very close to a signal line without a lead line to refer to a particular signal, for illustrative clarity.

In some cases, reference numbers may not be explicitly referred to in the specification when a similar element has been introduced in a previous figure (FIG). Furthermore, for clarity, some reference numbers and/or features may be omitted in certain drawing figures (FIGS).

Figure 1:
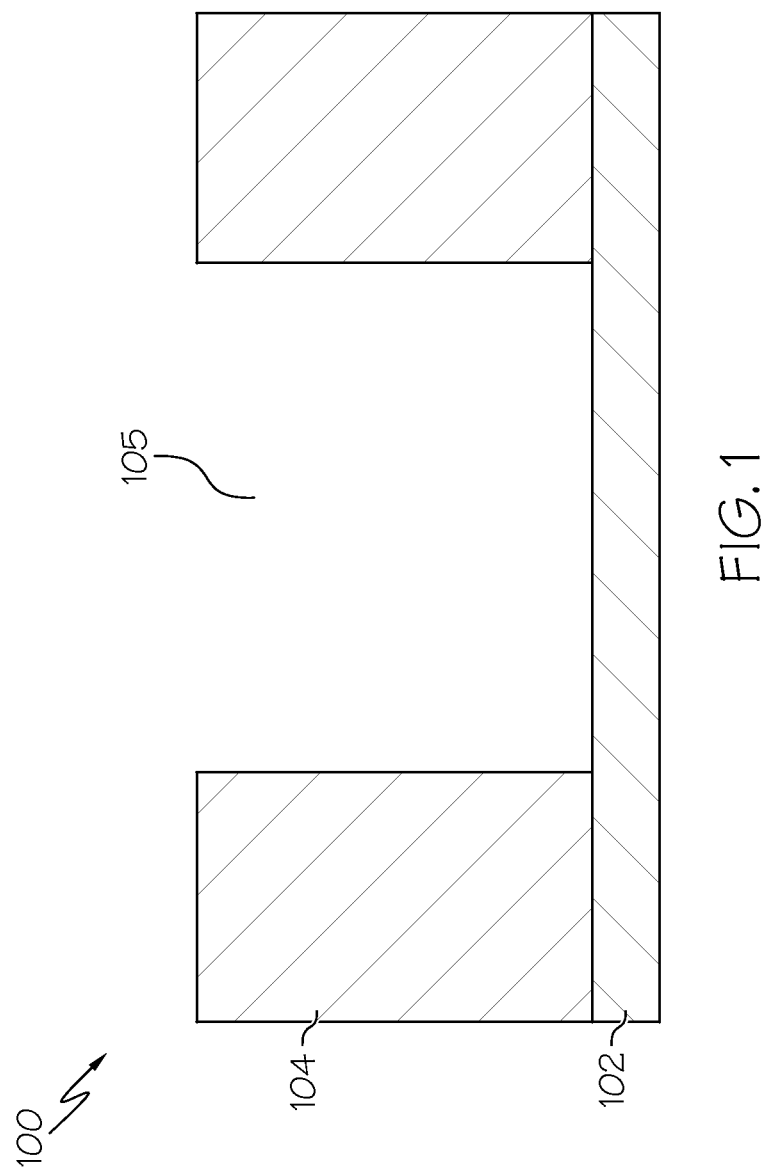

FIG. 1 shows a semiconductor structure at a starting point according to an embodiment of the present invention.

Figure 2:
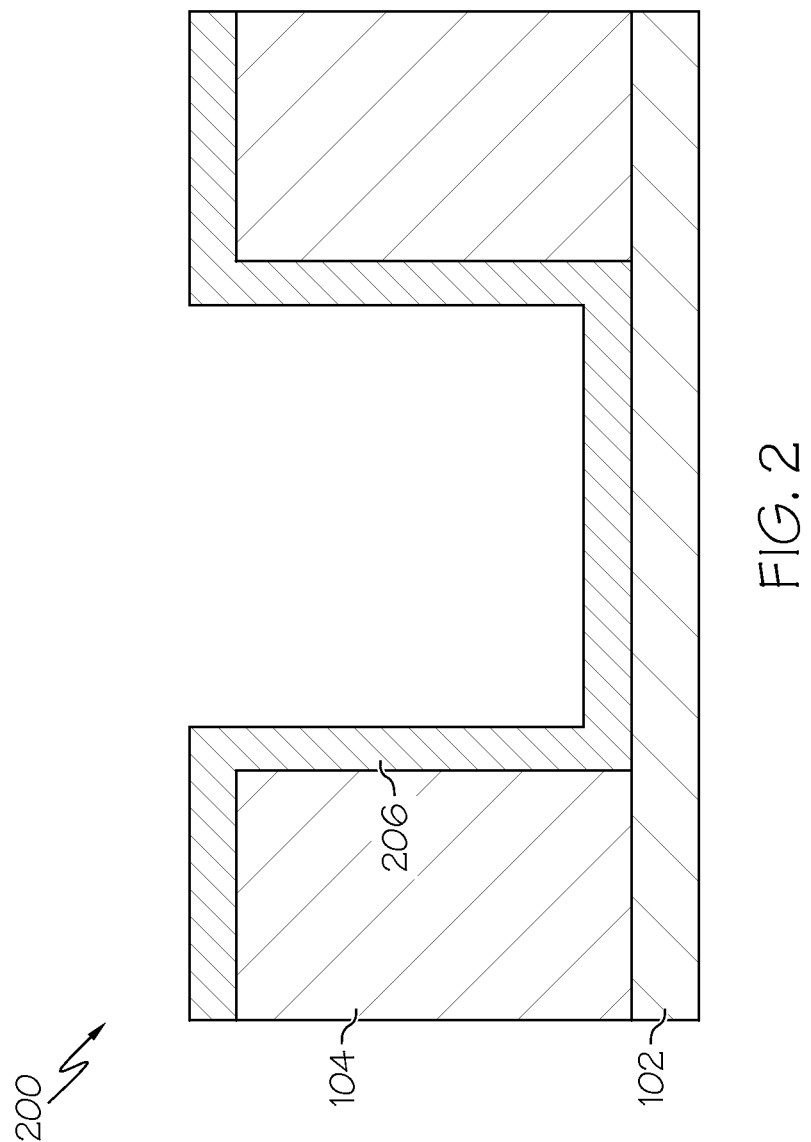

FIG. 2 shows a semiconductor structure after subsequent processing, including deposition of a gate dielectric layer according to an embodiment of the present invention.

Figure 3:
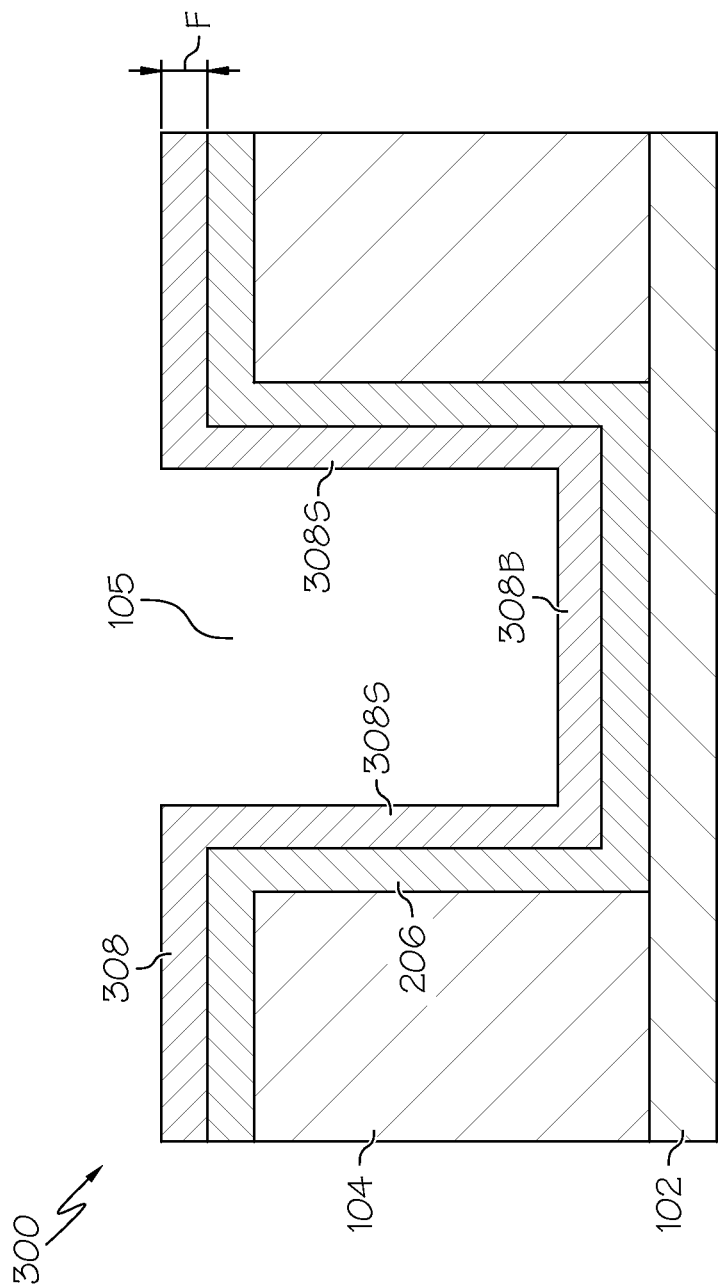

FIG. 3 shows a semiconductor structure after subsequent processing, including deposition of a first barrier layer according to an embodiment of the present invention.

Figure 4:
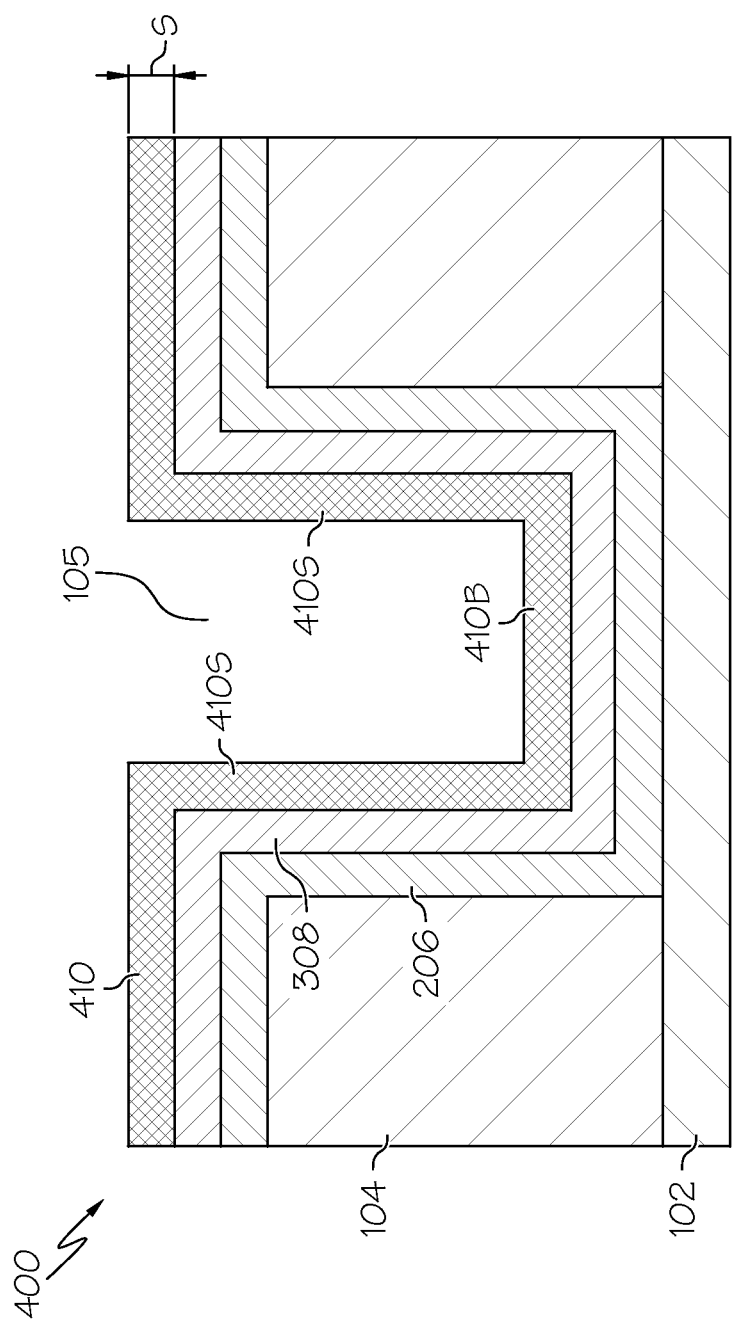

FIG. 4 shows a semiconductor structure after subsequent processing, including deposition of a second barrier layer according to an embodiment of the present invention.

Figure 5:
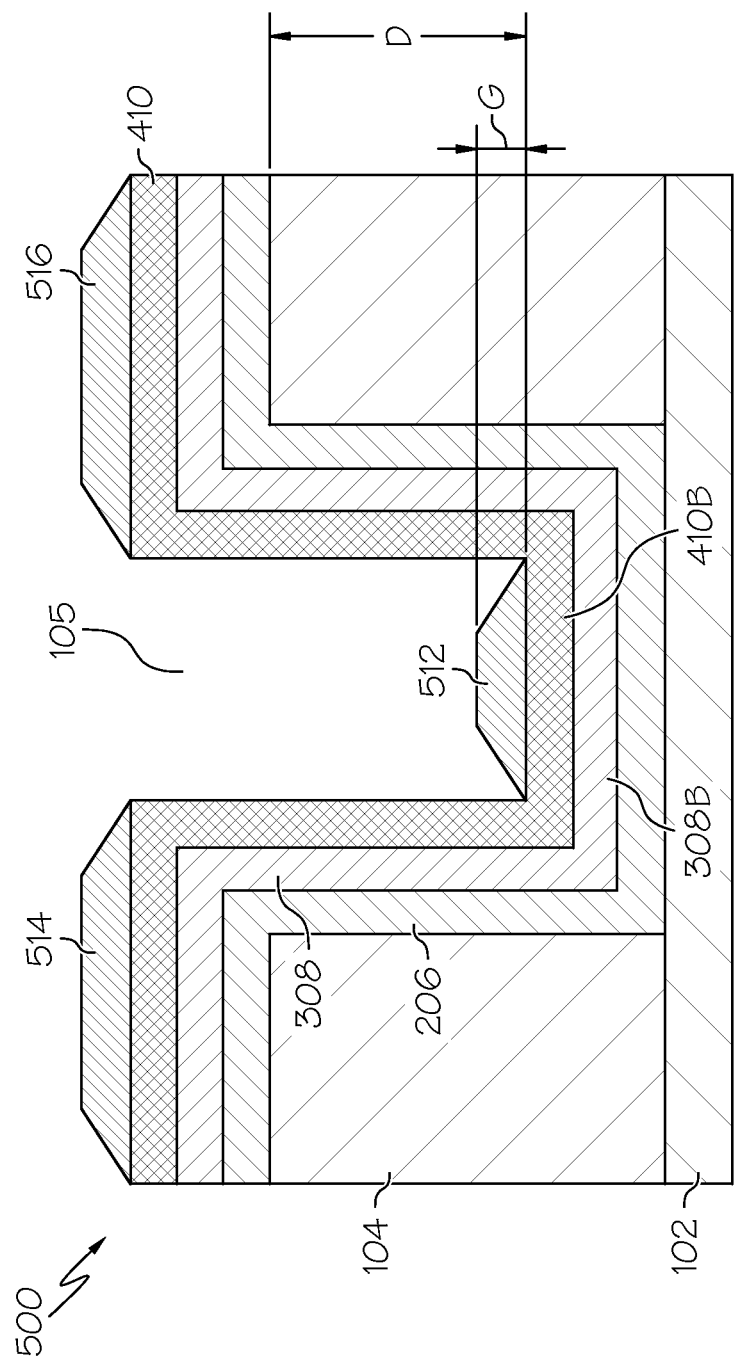

FIG. 5 shows a semiconductor structure after subsequent processing, including deposition of a first metal layer according to an embodiment of the present invention.

Figure 6:
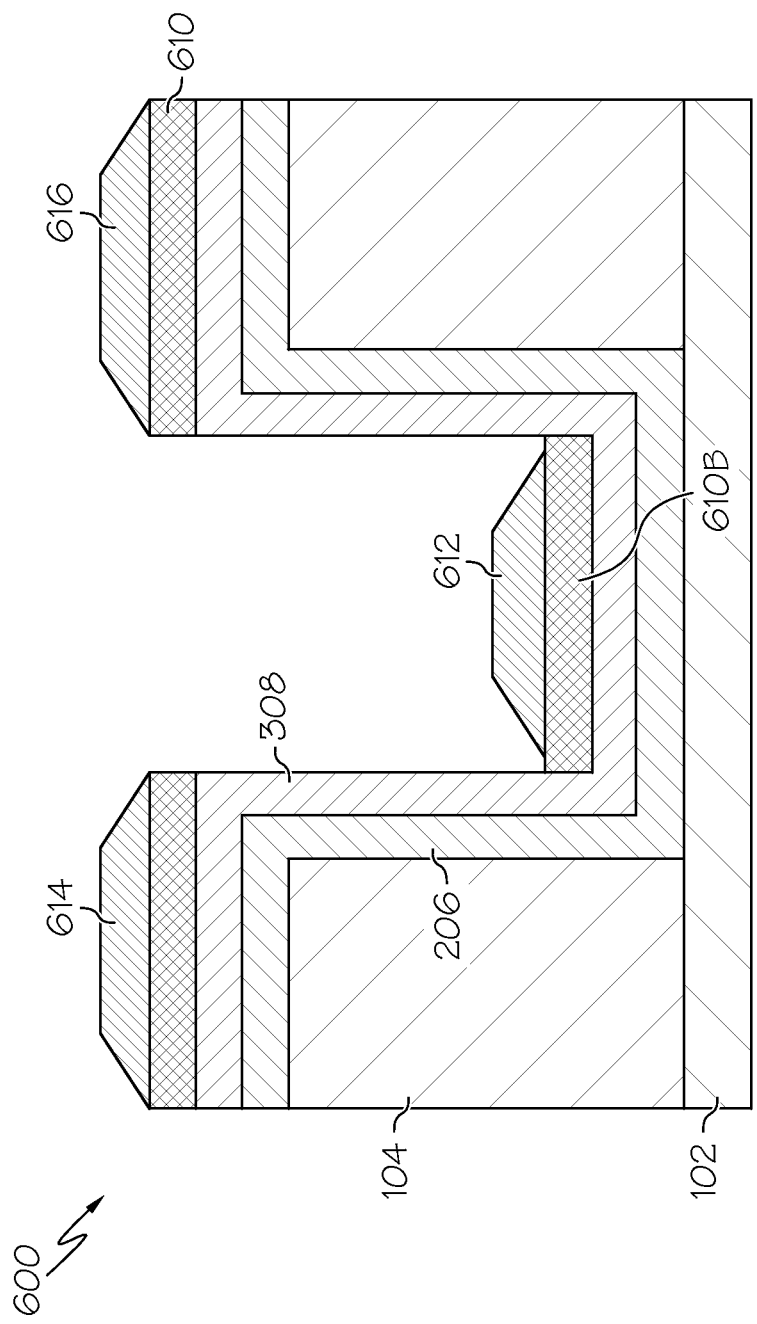

FIG. 6 shows a semiconductor structure after subsequent processing, including removal of the second barrier layer from the sidewalls according to an embodiment of the present invention.

Figure 7:
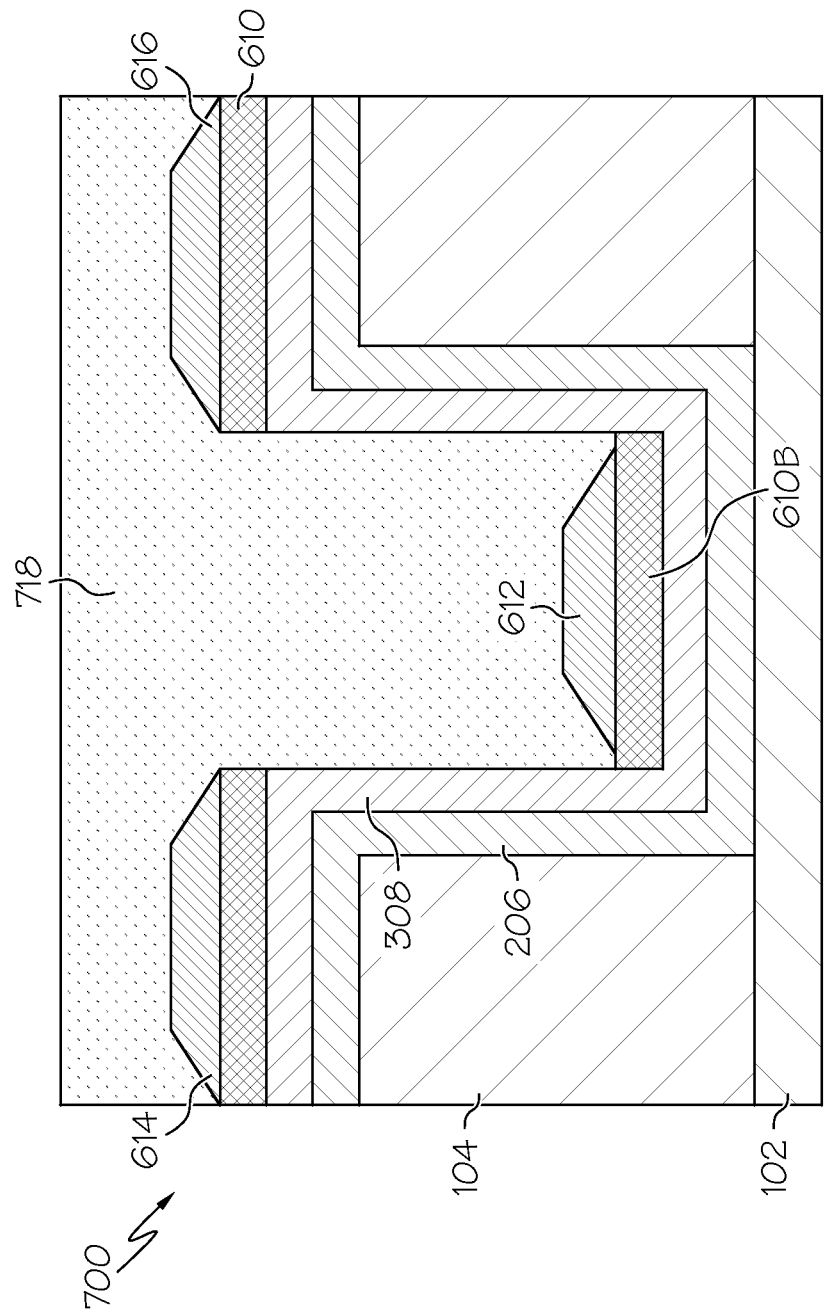

FIG. 7 shows a semiconductor structure after subsequent processing, including deposition of a second metal layer according to an embodiment of the present invention.

Figure 8:
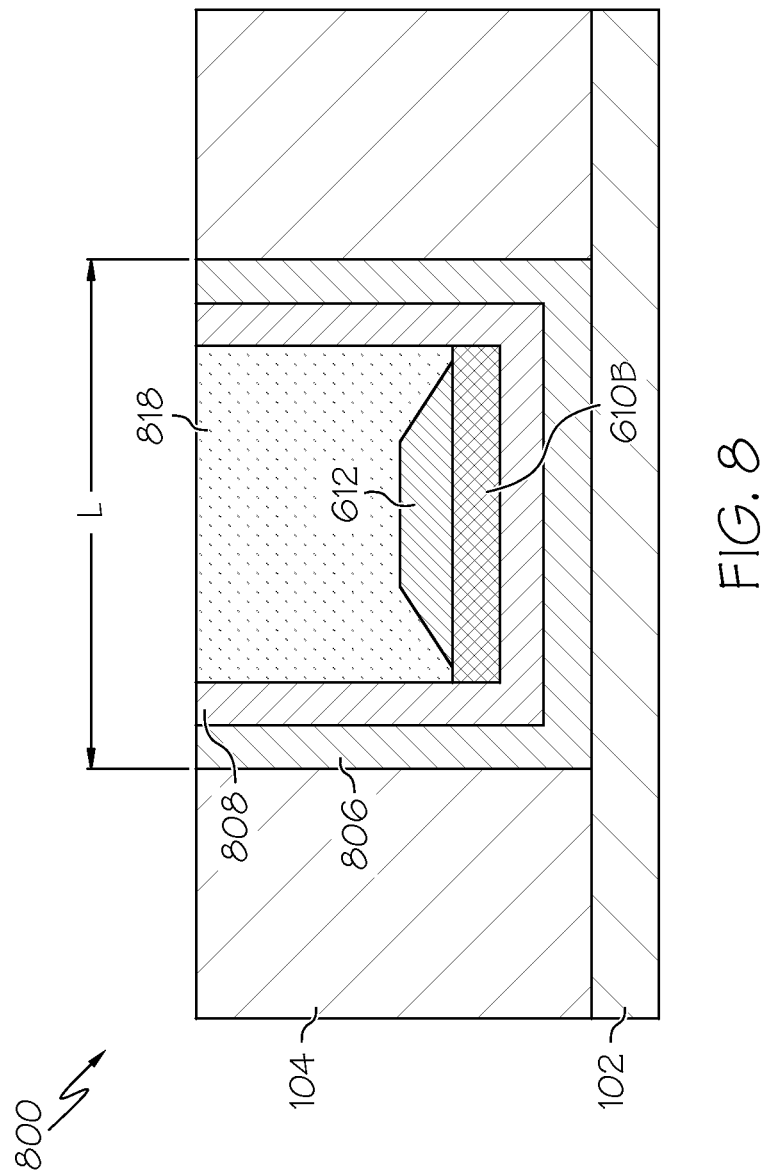

FIG. 8 shows a semiconductor structure in accordance with an embodiment of the present invention after subsequent processing, including planarization of the semiconductor structure according to an embodiment of the present invention.

Figure 9:
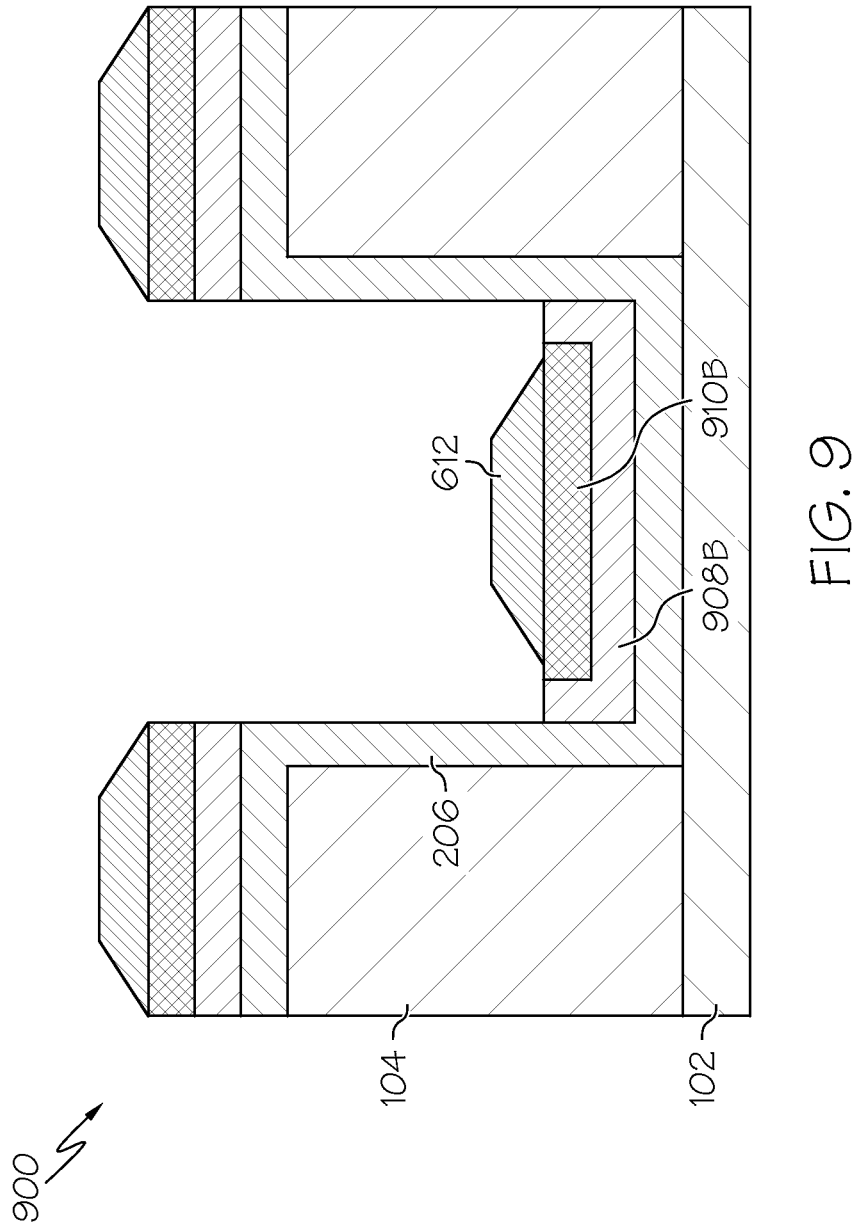

FIG. 9 shows a semiconductor structure in accordance with an alternative embodiment of the present invention, including removal of the first barrier layer from the sidewalls according to an embodiment of the present invention.

Figure 10:
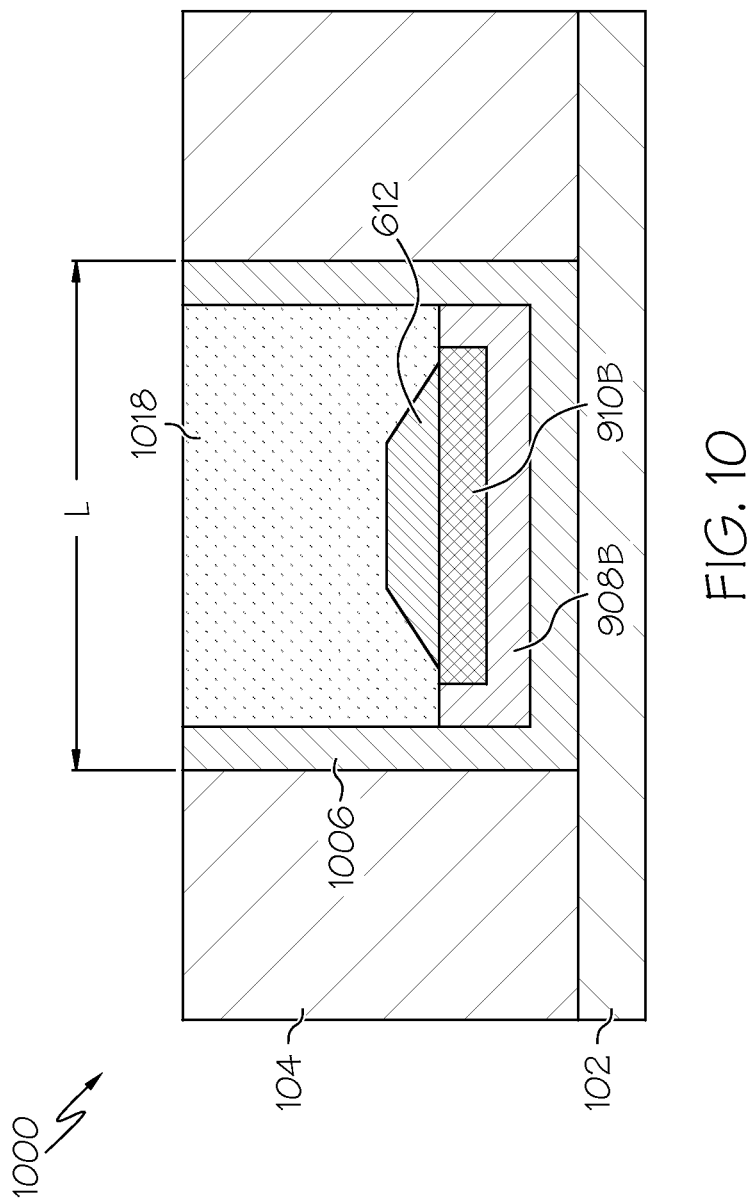

FIG. 10 shows a semiconductor structure in accordance with an alternative embodiment of the present invention after subsequent processing, including planarization of the semiconductor structure according to an embodiment of the present invention.

Figure 11:
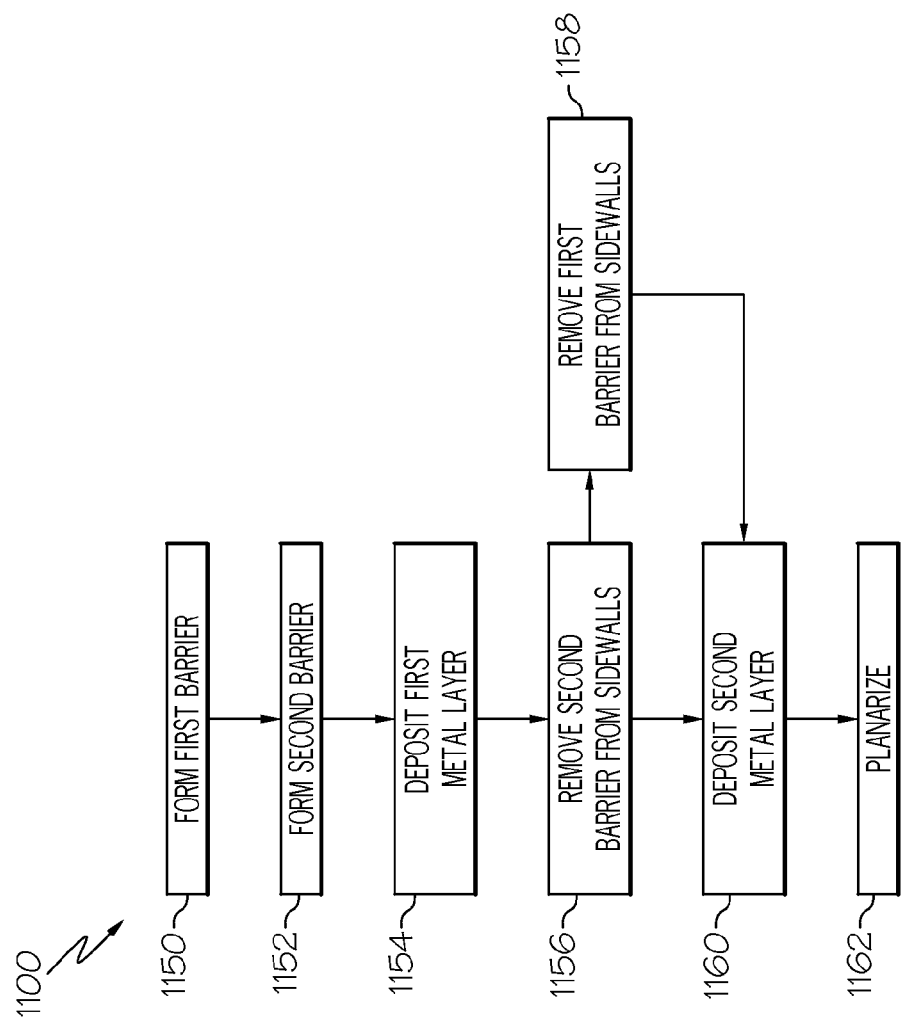

FIG. 11 is a flowchart showing process steps for embodiments of the present invention according to an embodiment of the present invention.

DETAILED DESCRIPTION

Exemplary embodiments will now be described more fully herein with reference to the accompanying drawings, in which exemplary embodiments are shown. Described are methods and techniques used in forming an improved field effect transistor. Specifically, exemplary embodiments of the invention provide approaches for removing one or more sidewall barrier layers to avoid adversely affecting the threshold voltage of the transistor.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

FIG. 1 shows a semiconductor structure 100 at a starting point for embodiments of the present invention. A dielectric layer 104 is disposed on a silicon substrate 102. The dielectric layer 104 may be comprised of silicon oxide (SiO2). A cavity 105 is formed in the dielectric layer 104. The cavity 105 may be formed in the dielectric layer 104 via an etch process, or other suitable technique.

FIG. 2 shows a semiconductor structure 200 after subsequent processing, including deposition of a gate dielectric layer 206. Gate dielectric layer 206 may be of a material including, but not limited to, Al2O3, HfO2 (hafnium oxide), ZrO3, Y2O3, La2O3, SiO2, nitrided SiO2, Si3N4, silicates, metal oxides, or mixtures and nitrogen additions thereof. Gate dielectric layer 206 may be deposited via atomic layer deposition (ALD).

FIG. 3 shows a semiconductor structure 300 after subsequent processing, including deposition of a first barrier layer 308. In some embodiments, first barrier layer 308 may be composed of titanium nitride (TiN). In some embodiments, first barrier layer 308 has a thickness F ranging from about 10 angstroms to about 15 angstroms. In some embodiments, first barrier layer 308 is deposited via atomic layer deposition (ALD). First barrier layer 308 includes base portion 308B at the base of the cavity 105, and sidewall portions 308S on the sidewall of the cavity 105.

FIG. 4 shows a semiconductor structure 400 after subsequent processing, including deposition of a second barrier layer. In some embodiments, second barrier layer 410 may be composed of tantalum nitride (TaN). In some embodiments, second barrier layer 308 has a thickness S ranging from about 10 angstroms to about 20 angstroms. In some embodiments, second barrier layer 308 is deposited via atomic layer deposition (ALD). Second barrier layer 410 includes base portion 410B at the base of the cavity 105, and sidewall portions 410S on the sidewall of the cavity 105.

FIG. 5 shows a semiconductor structure 500 after subsequent processing, including deposition of a first metal layer 512 on the base of cavity 105. In some embodiments, first metal layer 512 is deposited via physical vapor deposition (PVD), or radio frequency based physical vapor deposition (RFPVD). It is desirable to have a directional deposition such that first metal layer 512 is not deposited on sidewalls of the cavity 105. In some embodiments, first metal layer 512 may have a thickness G ranging from about 2 nanometers to about 10 nanometers. Hence, the first metal layer does not fill much of the cavity. In some embodiments, the cavity depth D is in the range of 50 nanometers to 200 nanometers. Hence, the ratio of the cavity depth D to the thickness G of the first metal layer 512 may, in some embodiments, range from about 5 to about 20.

In addition to metal layer 512, metal may also be deposited on the top of structure 500 (indicated by reference numbers 514 and 516). These metal regions will be removed in a subsequent planarization process. In some embodiments, first metal layer 512 is made of TiAl (titanium aluminum). One purpose of the first metal layer is to serve as a blocking layer to protect the base barrier regions during subsequent removal of sidewall barrier regions.

FIG. 6 shows a semiconductor structure 600 after subsequent processing, including removal of the second barrier layer 610 from the sidewalls. Base portion of the second barrier layer 610B remains in place, but the sidewall portions (compare with 410S of FIG. 4) are removed. The sidewall portions of the second barrier layer may be removed via a dry etch process. In some embodiments, the dry etch is performed with a fluorine based plasma such as SF6, NF3, or CF4. This can selectively etch the second barrier layer 410 (FIG. 5) over the first barrier layer 308 when the second barrier layer is made of TaN and the first barrier layer is made of TiN. First metal layer 612 may be slightly reduced in size compared to first metal layer 512 of FIG. 5, due to the dry etch process. However, first metal layer 612 is still of sufficient size to protect the first and second barrier layer regions below it. Similarly, metal regions 614 and 616 remain on the top surface of structure 600. These will be removed in a subsequent planarization process.

FIG. 7 shows a semiconductor structure 700 after subsequent processing, including deposition of a second metal layer 718. The second metal layer may include, but is not limited to, metals such as Pt, W, Cu, Ir, Ti, Zr, Hf, Ta, and Al or combinations and/or silicides thereof. In some embodiments, the second metal layer 718 is deposited via chemical vapor deposition (CVD). In other embodiments, physical vapor deposition (PVD) or atomic layer deposition (ALD) may be used.

FIG. 8 shows a semiconductor structure 800 in accordance with an embodiment of the present invention after subsequent processing, including planarization of the semiconductor structure. As compared with structure 700 of FIG. 7, the structure 800 is planarized to the level of dielectric layer 104. In some embodiments, the planarization is performed via a chemical mechanical polish (CMP) process.

The second barrier layer 610B may be made of TaN. The first barrier layer 808 may be made of TiN. Barrier layers such as TiN and TaN are useful to provide isolation between the gate dielectric layer 806 and the second metal layer 818, which may be referred to as the "gate metal." This is because the gate metal of an NFET is very reactive with oxygen. Without such barrier layers, a shift in threshold voltage (Vt) or leakage may occur. TiN and TaN have good properties as barriers for use with NFET metal gates. However, as the cavity width (gate length) L becomes smaller as the technology node size decreases, the effects of the work functions of TiN and TaN become significant contributors to the Vt of the transistor. As the gate length L decreases, the effect of the barrier on overall gate work function gets much bigger. Embodiments of the present invention remove the second barrier layer from the sidewalls (compare with 410S of FIG. 4). Thus, the Vt of the transistor is lowered, while still providing barrier protection against the bottom of the gate near the silicon substrate 102. In some embodiments, the gate length L ranges from about 20 nanometers to about 45 nanometers. In the embodiment of FIG. 8, the second metal layer 818 is disposed in the cavity, and is in direct physical contact with the first barrier layer 808 at the sidewalls. From this point forward, industry-standard fabrication techniques are used to complete the field effect transistor (e.g. implanting, metallization, etc.).

FIG. 9 shows a semiconductor structure 900 in accordance with an alternative embodiment of the present invention, including removal of the first barrier layer from the sidewalls. Hence, in this alternative embodiment, methods start with the structure of FIG. 5, and then proceed to remove sidewall portions of both the first and second barrier layers, such that only base portion 908B of the first barrier layer and base portion 910B of the second barrier layer remain. This can result in a transistor with an even lower Vt, since the effects of the barrier layers at the sides is mitigated by removing the sidewall portions.

FIG. 10 shows a semiconductor structure 1000 in accordance with an alternative embodiment of the present invention after subsequent processing, including deposition of a second metal layer (see FIG. 7) and planarization of the semiconductor structure. In this alternative embodiment, the second metal layer 1018 is disposed in the cavity, and is in direct physical contact with the gate dielectric 1006 at the sidewalls. This embodiment may be used when a designer wishes to lower the Vt as much as possible and is willing to forgo a barrier layer between the gate dielectric and the second metal layer. In some embodiments, the gate length L ranges from about 20 nanometers to about 45 nanometers. From this point forward, industry-standard fabrication techniques are used to complete the field effect transistor (e.g. implanting, metallization, etc.).

FIG. 11 is a flowchart 1100 showing process steps for embodiments of the present invention. In process step 1150, a first barrier layer is formed (see 308 of FIG. 3). In process step 1152, a second barrier layer is formed over the first barrier layer (see 410 of FIG. 4). In process step 1154, a first metal layer is deposited in the cavity (see 512 of FIG. 5). This serves as a blocking layer to protect the first and second barrier layers at the base of the cavity during subsequent barrier layer removal steps. In process step 1156, the second barrier layer is removed from the sidewalls of the cavity (see 600 of FIG. 6). Optionally, in process step 1158, the first barrier layer is also removed from the sidewalls of the cavity (see 900 of FIG. 9). In process step 1160, the second metal layer is deposited in the cavity (see 718 of FIG. 7). The second metal layer may be a metal for an NFET gate, including, but not limited to, Pt, W, Mo, Cu, Ir, Ti, Zr, Hf, Ta, and Al or combinations and/or silicides thereof. In process step 1162, the structure is planarized to the level of the dielectric layer in which the gate cavity is formed (see 800 of FIGS. 8 and 1000 of FIG. 10).

In various embodiments, design tools can be provided and configured to create the datasets used to pattern the semiconductor layers as described herein. For example, data sets can be created to generate photomasks used during lithography operations to pattern the layers for structures as described herein. Such design tools can include a collection of one or more modules and can also include hardware, software, or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLA)s, logical components, software routines, or other mechanisms might be implemented to make up a module. In implementation, the various modules described herein might be implemented as discrete modules, or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

It is apparent that there has been provided approaches for an improved field effect transistor and method of fabrication. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method of fabricating a semiconductor structure, comprising:
    depositing a first barrier layer in a cavity in a dielectric layer, the cavity having a base and sidewalls, and the first barrier layer having a top horizontal surface;
    depositing a second barrier layer over the first barrier layer, the second barrier layer having a top horizontal surface;
    depositing a first metal layer on a base portion of the cavity, disposed over the second barrier layer;

removing the second barrier layer from sidewalls of the first barrier layer, resulting in the entire remaining top horizontal surface of the second barrier layer being parallel with the entire top horizontal surface of the first barrier layer; and depositing a second metal layer in the cavity.

2. The method of claim 1, further comprising removing the first barrier layer from the sidewalls of the cavity prior to depositing a second metal layer in the cavity, wherein only a base portion of the first barrier layer remains.

3. The method of claim 1, further comprising planarizing the semiconductor structure.

4. The method of claim 3, wherein planarizing the semiconductor structure comprises performing a chemical mechanical polish.

5. The method of claim 1, wherein depositing the first barrier layer is performed via atomic layer deposition.

6. The method of claim 1, wherein depositing the second barrier layer is performed via atomic layer deposition.

7. The method of claim 1, wherein depositing the first barrier layer comprises depositing TiN.

8. The method of claim 7, wherein depositing TiN comprises depositing a TiN layer having a thickness ranging from about 10 angstroms to about 15 angstroms.

9. The method of claim 1, wherein depositing the second barrier layer comprises depositing TaN.

10. The method of claim 8, wherein depositing TaN comprises depositing a TaN layer having a thickness ranging from about 10 angstroms to about 20 angstroms.

11. The method of claim 1, wherein depositing the first metal layer in the cavity comprises depositing TiAl.

12. The method of claim 11, wherein depositing TiAl is performed via a physical vapor deposition process.

13. A method of fabricating a semiconductor structure, comprising:

depositing a first barrier layer in a cavity in a dielectric layer, the cavity having a base and sidewalls, and the first barrier layer having a top horizontal surface;

depositing a second barrier layer over the first barrier layer, the second barrier layer having a top horizontal surface;

depositing a first metal layer on a base portion of the cavity via radio frequency based physical vapor deposition, wherein the first metal layer is disposed over the second barrier layer;

removing the second barrier layer from sidewalls of the first barrier layer, resulting in the entire remaining top horizontal surface of the second barrier layer being parallel with the entire top horizontal surface of the first barrier layer; and depositing a second metal layer in the cavity.

14. The method of claim 13, wherein removing the second barrier layer is performed via a dry etch process.

15. The method of claim 13, wherein depositing a second metal layer comprises depositing a metal from the group consisting of: Al, Pt, W, Ti, Cu, Ir, Ti, Zr, Hf, and Ta.

* * * * *

UNITED STATES PATENT AND TRADEMARK OFFICE
CERTIFICATE OF CORRECTION

| | | |
|---|---|---|
| PATENT NO. | : 8,853,069 B2 | Page 1 of 1 |
| APPLICATION NO. | : 13/607954 | |
| DATED | : October 7, 2014 | |
| INVENTOR(S) | : Kim et al. | |

It is certified that error appears in the above-identified patent and that said Letters Patent is hereby corrected as shown below:

In the Claims, Column 7:

Claim 8, Lines 22-24, delete "7, wherein depositing TiN comprises depositing a TiN layer having a thickness ranging from about 10 angstroms to about 15 angstroms."; and Insert -- 1, wherein depositing the second barrier layer comprises depositing TaN. --; and Claim 9, Lines 25-26, delete "1, wherein depositing the second barrier layer comprises depositing TaN."; and Insert -- 7, wherein depositing TiN comprises depositing a TiN layer having a thickness ranging from about 10 angstroms to about 15 angstroms. --.

Signed and Sealed this
Twenty-seventh Day of January, 2015

Michelle K. Lee
*Deputy Director of the United States Patent and Trademark Office*